United States Patent [19]
Nishizaka

[11] Patent Number: 5,635,748
[45] Date of Patent: Jun. 3, 1997

[54] NAND ROM WITH TRANSISTOR STRINGS LOCATED AT TRENCH BOTTOMS AS WELL AS BETWEEN TRENCHES

[75] Inventor: Teiichiro Nishizaka, Tokyo, Japan

[73] Assignee: NEC Corporation, Tokyo, Japan

[21] Appl. No.: 370,818

[22] Filed: Jan. 10, 1995

Related U.S. Application Data

[63] Continuation of Ser. No. 978,519, Nov. 18, 1992, abandoned.

[30] Foreign Application Priority Data

Nov. 20, 1991 [JP] Japan .................. 3-304293

[51] Int. Cl.⁶ ............................................. H01L 29/78
[52] U.S. Cl. .................. 257/390; 257/330; 257/401; 365/104
[58] Field of Search ........................ 257/374, 382, 257/390, 510, 903, 395, 396, 397, 401, 330, 334, 331, 391; 365/104, 149, 96, 103

[56] References Cited

U.S. PATENT DOCUMENTS

| | | | |
|---|---|---|---|
| 4,271,421 | 6/1981 | McElroy | 365/104 |
| 4,805,143 | 2/1989 | Matsumoto et al. | 365/104 |
| 4,989,055 | 1/1991 | Redwine | 257/302 |
| 5,306,941 | 4/1994 | Yoshida | 257/390 |

FOREIGN PATENT DOCUMENTS

| | | | |
|---|---|---|---|
| 58219783 | 6/1985 | Japan | 257/397 |
| 61236089 | 4/1988 | Japan | 257/397 |

*Primary Examiner*—Jerome Jackson
*Assistant Examiner*—Nathan Kip Kelley
*Attorney, Agent, or Firm*—Burns, Doane, Swecker & Mathis, LLP

[57] ABSTRACT

A NAND ROM with an improved integration level is described. A number of trenches are formed in stripe pattern at the surface of a semiconductor substrate, and an insulating film for isolation between devices is formed at the sidewalls, respectively, of each trench. A first unit array consisting of MOSFETs connected in series is arranged in each first active region defined between two adjacent trenches. A second active region is defined in the bottom of each trench and a second unit array is arranged therein. Distinguished from the trench isolation technique which provides trenches between unit arrays, instead, according to the present invention, sidewalls of insulating film are formed. The trench width is limited to the minimum feature size involving the lithography. On the other hand, the width of the insulating-film sidewalls are independent of the limitation, permitting the size of the 64-Mbit mask ROM chip to be about 2 mm smaller.

6 Claims, 20 Drawing Sheets

NAND ROM WITH TRANSISTOR STRINGS LOCATED AT TRENCH BOTTOMS AS WELL AS BETWEEN TRENCHES

This application is a continuation of application Ser. No. 07/978,519, filed Nov. 18, 1992, now abandoned.

BACKGROUND OF THE INVENTION

1. Field of the Invention

This invention relates to a semiconductor memory device, and more particularly to a NAND ROM.

2. Description of the Prior Art

In recent years integration levels of MOS semiconductor integrated circuits have been becoming markedly higher and higher.

With increasing integration level, MOS-transistor NAND ROMs are moving from 32- to 64-Mbit memory capacity per chip.

A NAND ROM comprises unit arrays consisting of rows of memory transistors connected in series and being connected through unit selective transistors between digit lines and ground lines. It is common that on a semiconductor chip are arranged a plurality of cell array blocks each comprises a number of parallel digit lines running in the column direction. Along each digit line, one or two rows of unit arrays are disposed.

For MOS devices, previously the local oxidation technique was used for isolation between the above-mentioned unit array rows. Recently it has been replaced by the trench isolation technique. The trench isolation technique involves building, on a semiconductor chip, trenches having a predetermined-width, and, after forming a silicon oxide film over the surface of them, filling them with an insulating material such as BPSG film. The size, especially width, of the thus-built device isolation structures is one of major factors limiting integration levels of NAND ROMS because they are limited to the minimum feature size involving the lithography technique. For example, letting the minimum feature size be 0.4 μm, the space between unit array rows is not allowed to be set smaller than this size.

SUMMARY OF THE INVENTION

It therefore is an object of the present invention to provide a NAND ROM capable of being integrated to a higher level than when using trench isolations.

A NAND ROM according to the present invention comprises a plurality of cell array block regions isolated by first device isolation structures selectively formed on a semiconductor substrate. Each cell array block region is provided with a plurality of trenches of a predetermined width at a specified pitch. At sidewalls of each trench are formed insulating films which act as the second device isolation structure. Each area between adjacent two of the previously mentioned trenches is defined as the first active region, and the portion of the trench bottom not be placed in contact with the insulating film sidewalls is defined as the second active region. Over the first and second active regions, respectively, a plurality of branch word-lines is arranged in the direction crossing these regions, respectively, with the interposition of the first and second gate insulating films, respectively. Self-aligned source and drain regions to the branch word-lines are provided in the first and second active regions, respectively. In other words, the first and second unit arrays each consisting of a plurality of cell transistors connected in series are arranged in the first and second active regions.

One end of each of the first and the adjacent second unit arrays are connected to a digit line through the first and second unit selective circuits, respectively. The other ends are connected to a ground line.

The NAND ROM as described above can be realized by the following fabricating process.

On the semiconductor substrate, field oxide films are selectively formed to isolate cell array block regions. On the surface of these regions are deposited in sequence the first gate insulating film, the first polycrystalline silicon (referred to as polysilicon hereinafter) film, and an etching resistant film which can be etched at a small rate compared with the first polysilicon, preferably silicon oxide film. After forming a mask by patterning the three layers: the etching-resistant film, the first polysilicon film and the first gate insulating film to define a trench in the cell array block region, the substrate is selectively etched to produce trenches. Thus the first active region is defined by the field oxide film and the trench. Besides an insulating film such as silicon oxide film is deposited over the whole surface and then etched anisotropically, leaving only the sidewalls of the trench as device-isolation insulating film. Thus the second active region is defined, and on the surface of which the second gate insulating film is formed. Over the whole surface, the second polysilicon film is deposited, and then using a resist film covering only the trench portion of the second polysilicon film as mask, this second polysilicon film and the etching-resistant film are etched. A high melting point metal silicide film as of tungsten silicide is deposited, and subsequently patterning is done to form branch word-lines. These branch word-lines are of polycide structure in the greater part. Further ion implantation for forming lightly-doped source/drain regions, formation of insulating spacers at the sidewalls of each word-line branch, and ion implantation for forming highly-doped source/drain are in sequence performed. Finally ion implantation is performed into selected ones of the first and second active regions underneath the branch word-lines.

The insulating film constituting the device isolation sidewalls between the neighboring active regions can be formed to a thicknesses smaller than the minimum feature size involving lithography and hence permits higher integration level of NAND ROM.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
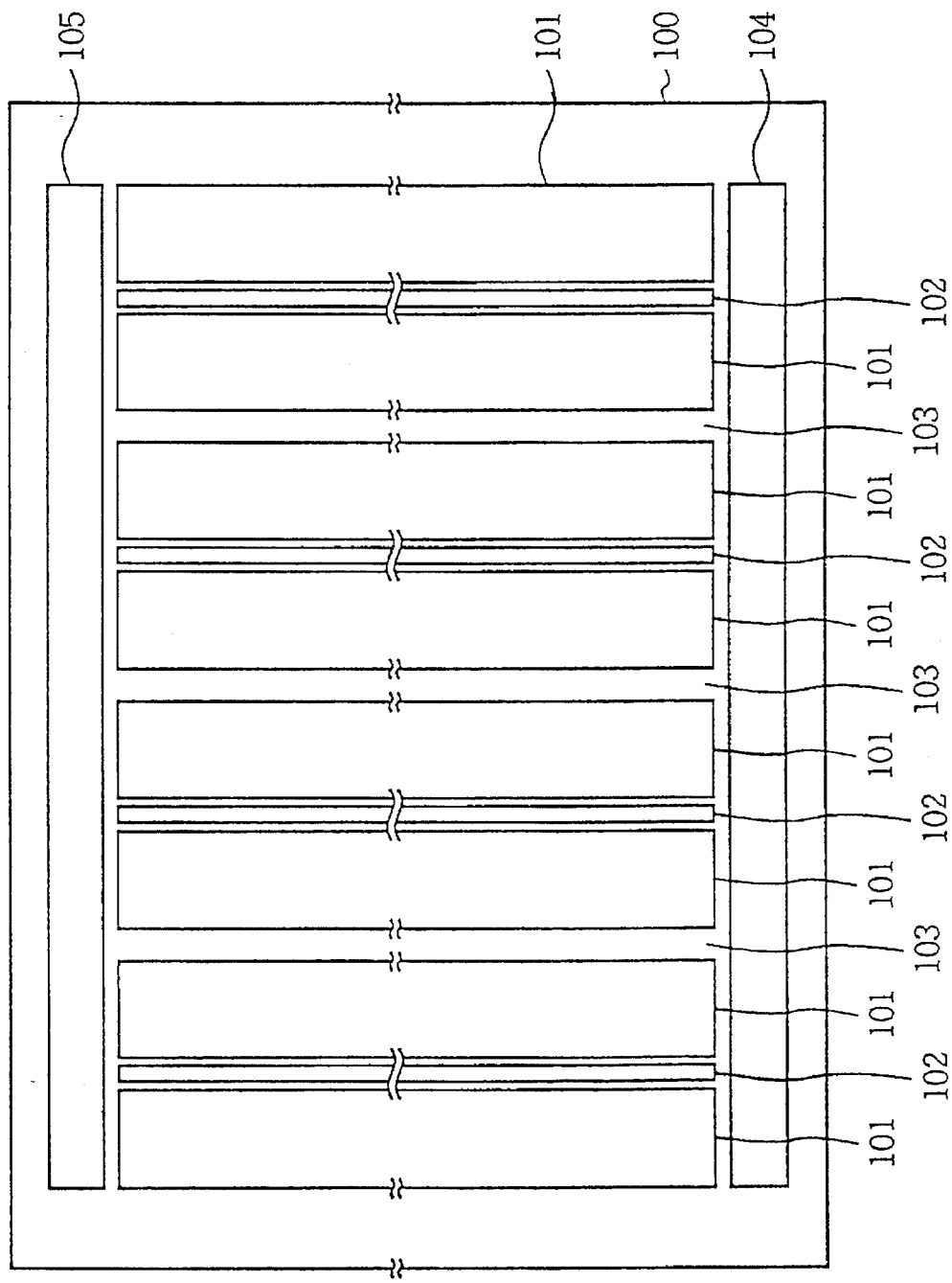
FIG. 1 is a plan view showing schematically the layout including cell array block regions, etc. on the semiconductor chip as an embodiment of the present invention.

Referring to FIG. 1 will be described hereinafter an embodiment of the present invention which is a 64-Mbit NAND ROM built on a rectangular (7.6 mm×12.5 mm) semiconductor chip 100. It comprises 8 cell array block regions 101 (0.65 mm×9.7 mm) arranged at 0.2 mm intervals. In every other space between these regions are provided X-block decoders 102 having 1024 output lines. Peripheral circuits 104, 105 are disposed along the opposite short edges of the semiconductor chip. Peripheral circuit 104 includes 8 X-main decoders each with 16 output lines and 8 Y-selectors for selecting 512 digit lines. Peripheral circuit 105 includes 8 Y-selectors for selecting 512 digit lines and a Y-decoder for selecting 8 cell array blocks.

Each cell array block contains a plurality of unit arrays.

Figure 2:
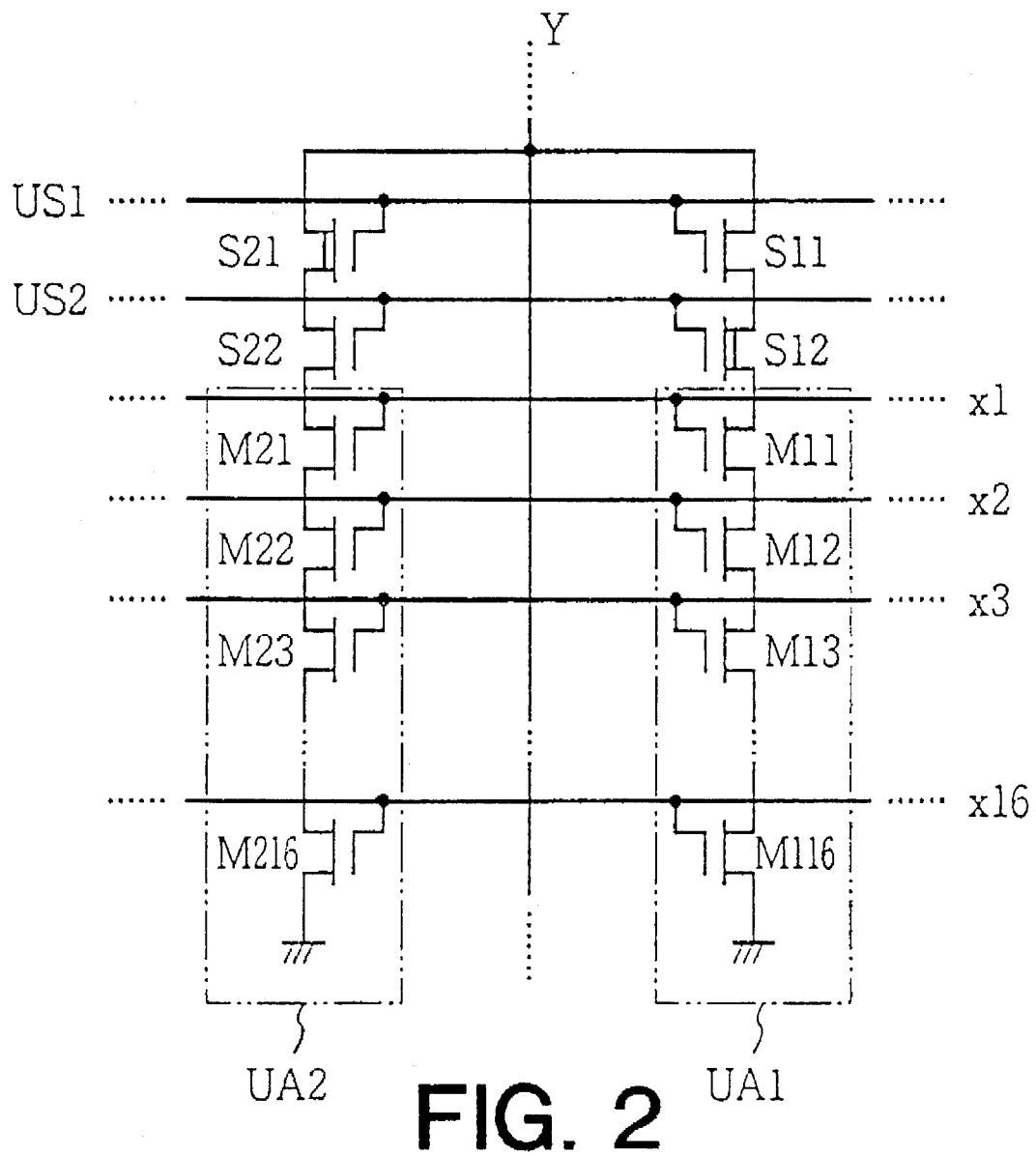
FIG. 2 is a circuit diagram showing a unit array pair in the same embodiment.
Figure 3:
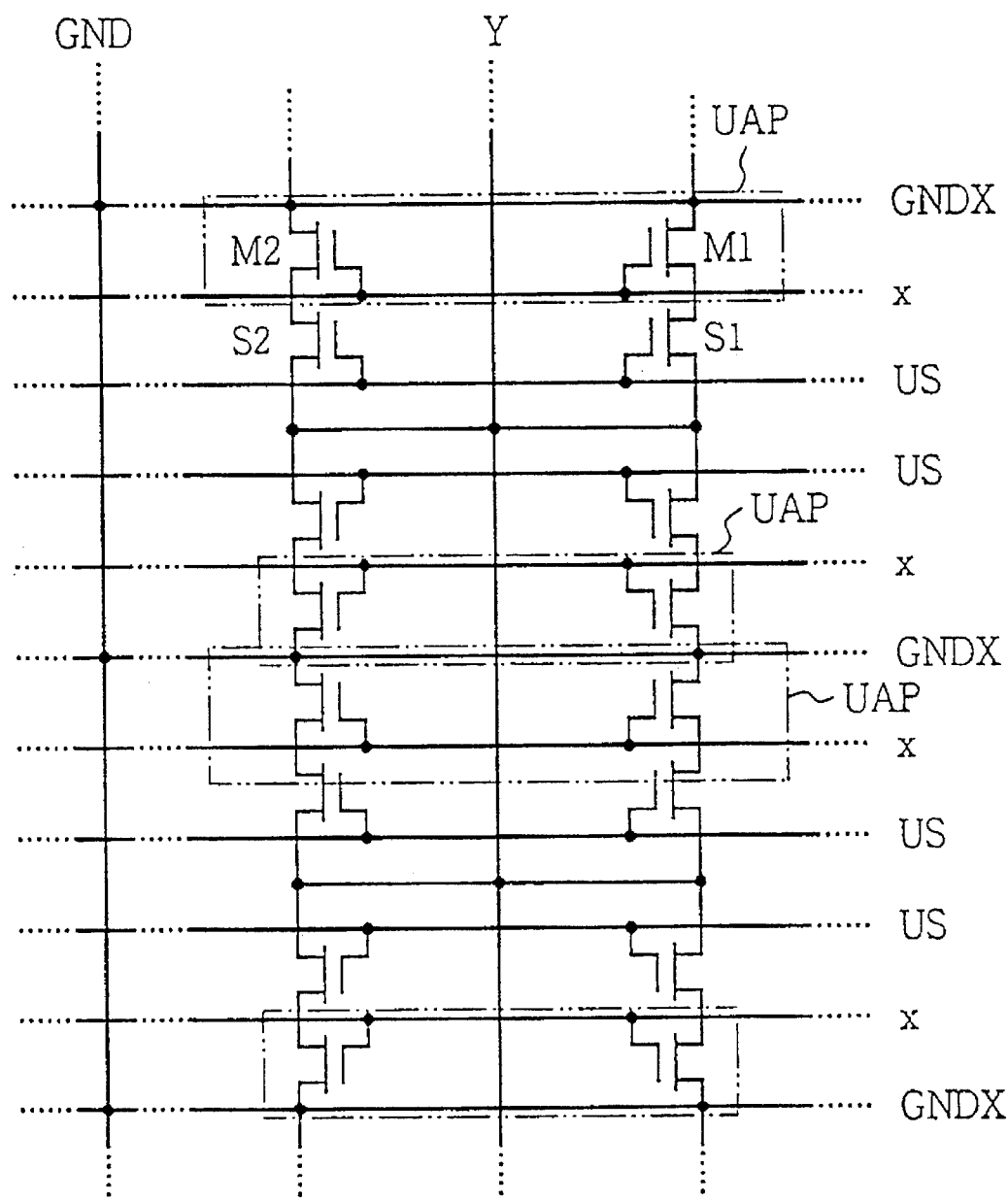
FIG. 3 is a schematic circuit diagram of a group of unit array pairs connected to a digit line in the same embodiment.

Referring to FIG. 2, the first and second unit arrays UA1, UA2 are connected parallel to one digit line Y through selective transistors S11/S12 and S21/S22. Similar 512 unit array pairs are connected to one digit line as described later. The first unit array UA1 consists of 16 cell transistors M11, M12, ..., M116 connected in series. Similarly the second unit array UA2 consists of 16 cell transistors M21, M22, ..., M216 connected in series. These cell transistors, for convenience sake, are all shown as enhancement mode though in practice they are combined with depletion mode. Which cell transistors are made depletion mode is based on data to be written on a RON. Selected transistors S12 and S21 are of depletion mode. Moving the potential of which unit selective line US1 or US2 to "H" causes either the first unit array UA1 or the second UA2 to connect to the digit line. $x_1, x_2, \ldots, x_{16}$ are branch word-lines described later. As shown in FIG. 3, a plurality of such unit array pairs UAP is connected to one digit line Y. In FIG. 3 reference characters represent as in the following: M1 and M2 each, 16 transistors S1 and S2 each, 2 selective transistors; US, 2 unit selective lines; x, 16 branch word-lines; GNDX, ground lines running perpendicular to digit line Y (referred to as X-ground lines hereinafter) in the cell array block; and GND, a ground line running parallel to digit line Y (referred to as Y-ground line hereinafter) through which X-ground lines are interconnected.

Figure 4:
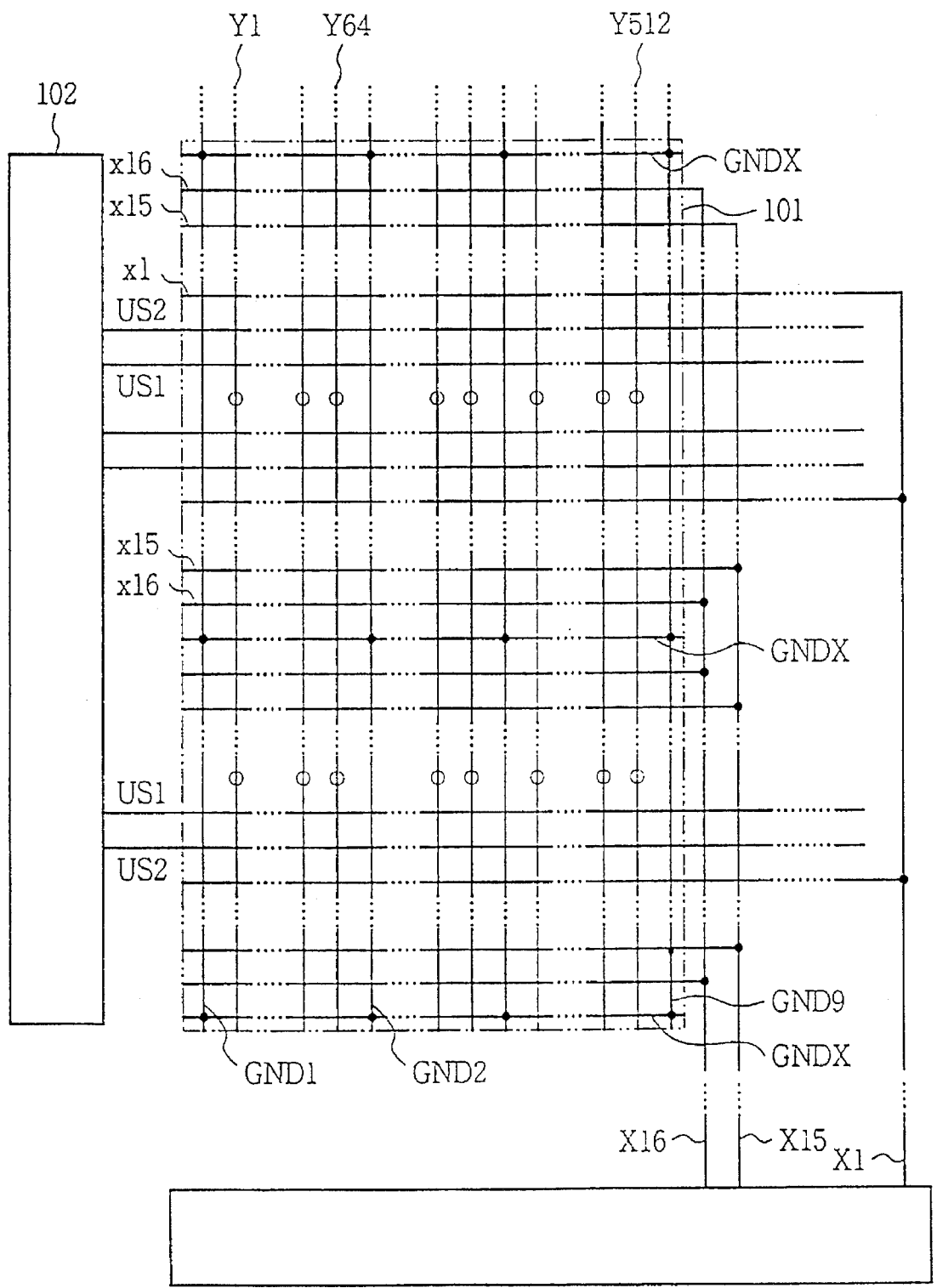
FIG. 4 is a plan view showing schematically the layout of a cell array block in the same embodiment.

Referring to FIG. 4, cell array block region 101 contains digit lines Y1, Y2, ..., Y512 running vertically as shown; 512 groups each of branch word-lines x1, x2, ..., x16 running horizontally as shown; and 512 groups each of unit selective lines US1 and US2 running horizontally. Digit lines Y1, Y2, ..., are connected to peripheral circuit 105 (FIG. 1). Each group of branch word-lines x1, x2, ... meets a trunk word-line X1, X2, ..., or X512 in line-distribution region 103 (FIG. 1), and connected to X-main decoder 104a. Unit selective lines US1, US2 are connected to X-block decoder 102 There are further provided Y-ground lines GND1, GND2, ..., GND9 every 64 digit lines. Open circles shown represent connections between digit lines and unit arrays.

The construction of cell array blocks outlined above is not limit the present invention.

The detailed structure of the cell array block will be described in processing sequence with reference to FIGS. 5 to 17.

At the surface of a p-type silicon substrate a p-well of 4 to 6 μm deep and $5 \times 10^{16}$ cm$^{-3}$ in impurity concentration is formed over the substantially whole surface for peripheral circuits consisting of n-channel MOSFETs or except the p-channel MOSFET-fabricated region for them consisting of CMOSs. Description in the following will be given assuming peripheral circuits consisting of n-channel MOSFETs.

Figure 5A:
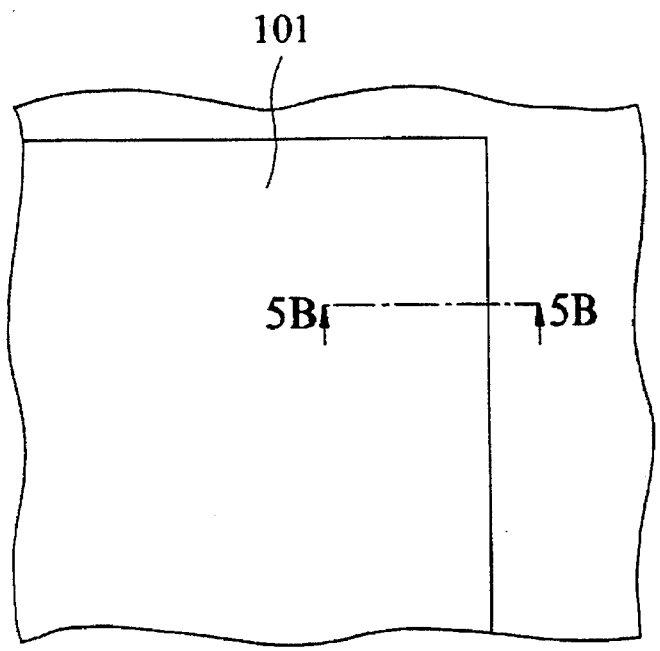
FIG. 5(a) is a plan view for illustrating a process for fabricating the same embodiment.
Figure 5B:
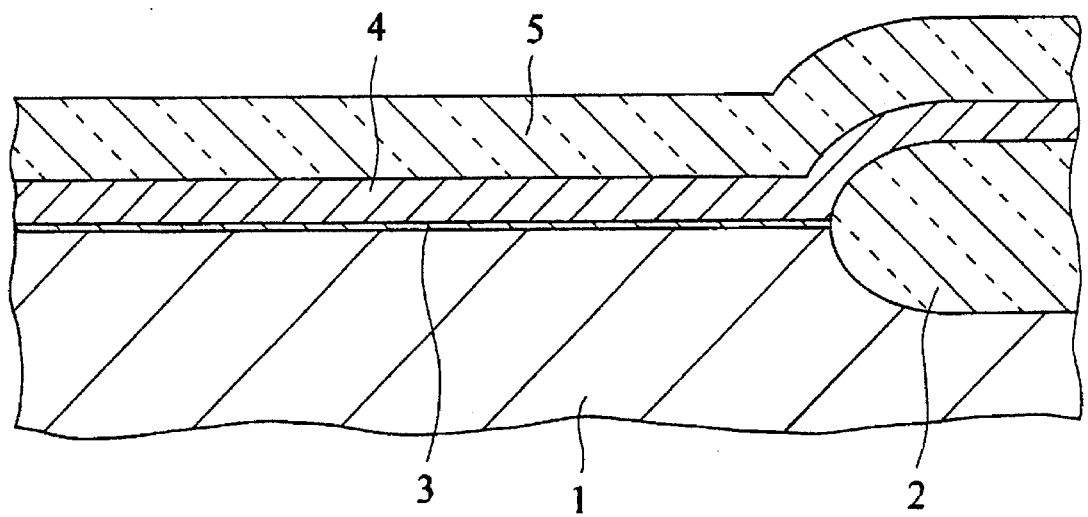
FIG. 5(b) is an enlarged cross-sectional view taken along line A—A of FIG.5 (a).

As shown in FIGS. 5(a), and 5(b), field oxide films 2 are grown to a thickness of 0.4 μm using the local oxidation technique to isolate cell array blocks 101, and other device regions (not shown): X-block decoders and peripheral circuits. On the surface portions of p-well 1 within cell array block regions 101 and within device regions is formed first gate oxide films 3 of 10 to 20 nm thick, and then over the entire surface the first phosphorus-doped polysilicon film 4 of 100 nm thick and a silicon oxide film 5 of 200 nm thick are deposited in sequence as etching masks.

Figure 6A:
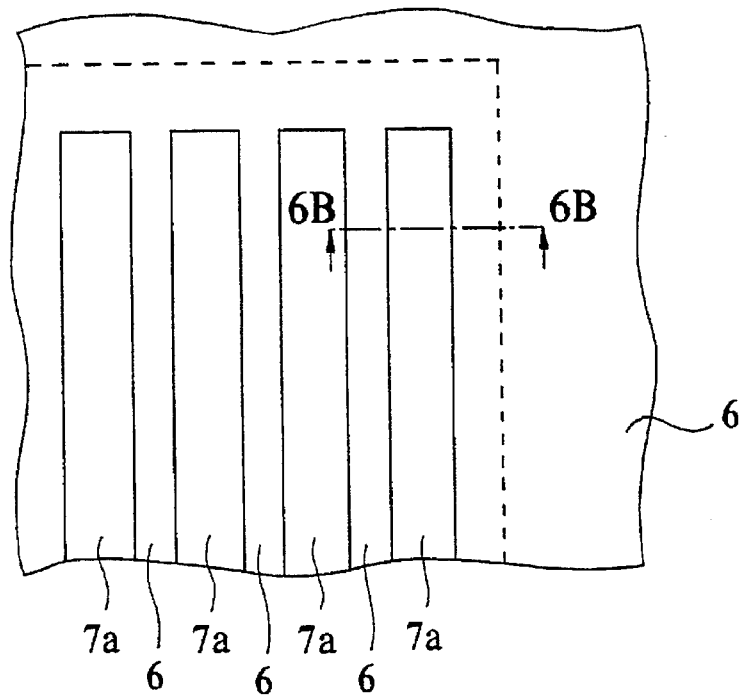
FIG. 6(a) is a plan view corresponding to FIG. 5 for illustrating the next processing step.
Figure 6B:
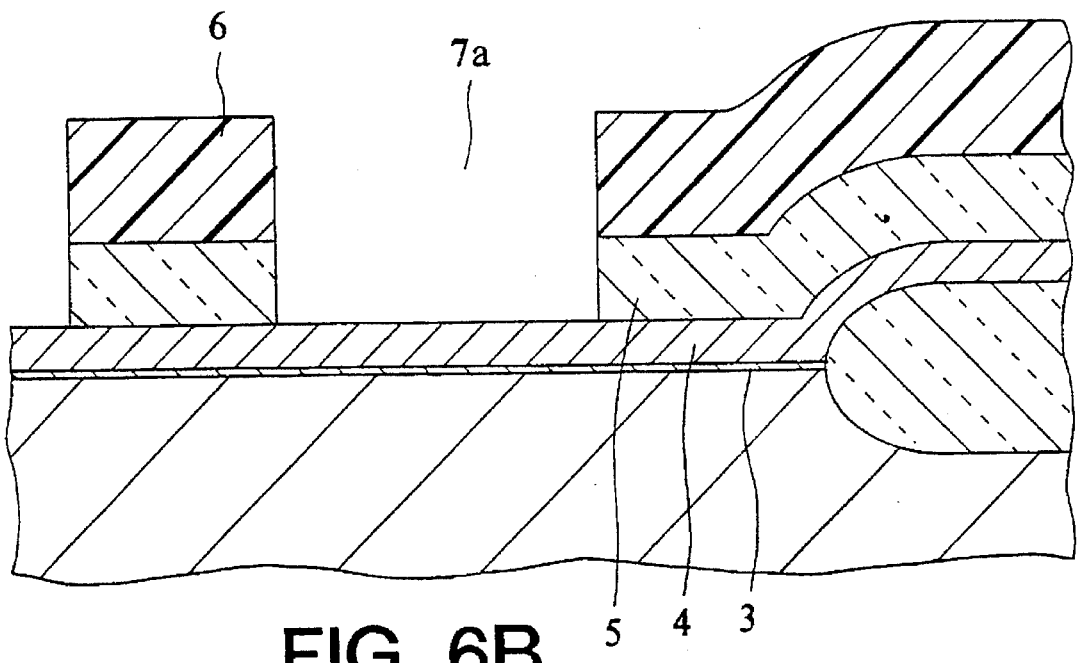
FIG. 6(b) is an enlarged cross-sectional view taken along line A—A of FIG. 6(a).
Figure 7:
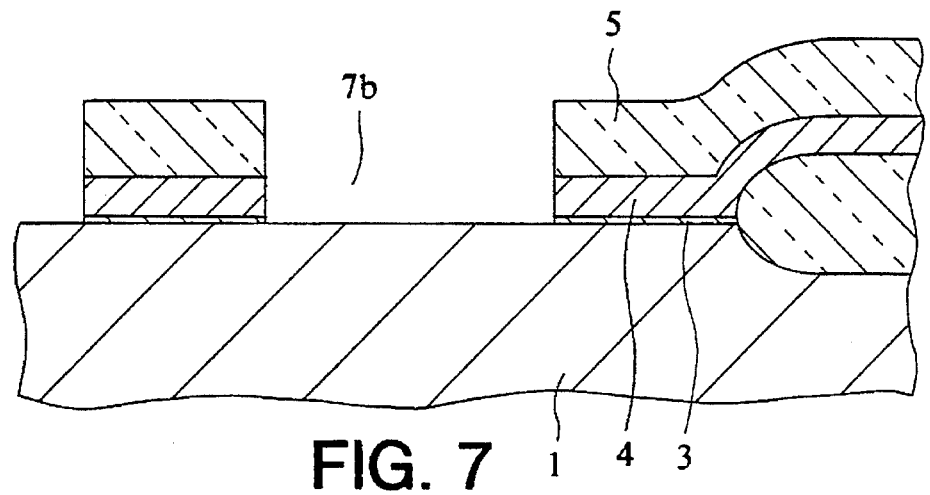
FIG. 7 is a similar cross-sectional view for illustrating the processing step following FIG. 6.

As shown in FIG. 6, after coating with a photoresist film 6, a plurality of parallel stripe-windows 7 $a$ of 0.8 μm wide over the whole cell array region is opened at 0.5 μm intervals. Using this patterned photoresist film 6 as mask, silicon oxide film 5 is etched. After removing photoresist film 6, the first polysilicon film 4 and the first gate oxide film 3 are etched using as mask the patterned silicon oxide film provided with windows by anisotropic etching with carbon tetrachloride $CCl_4$ gas, to open windows 7$b$ as shown in FIG. 7.

Figure 8:
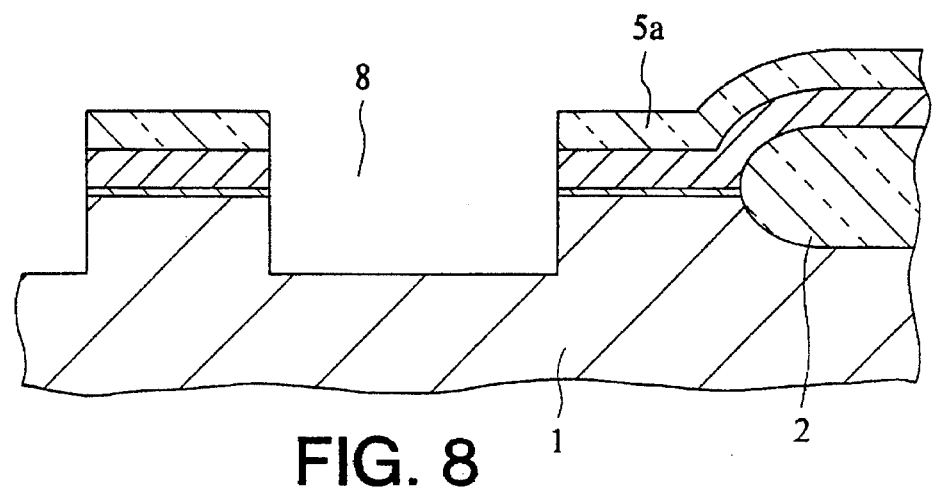
FIG. 8 is a similar cross-sectional view for illustrating the processing step following FIG. 7.
Figure 9:
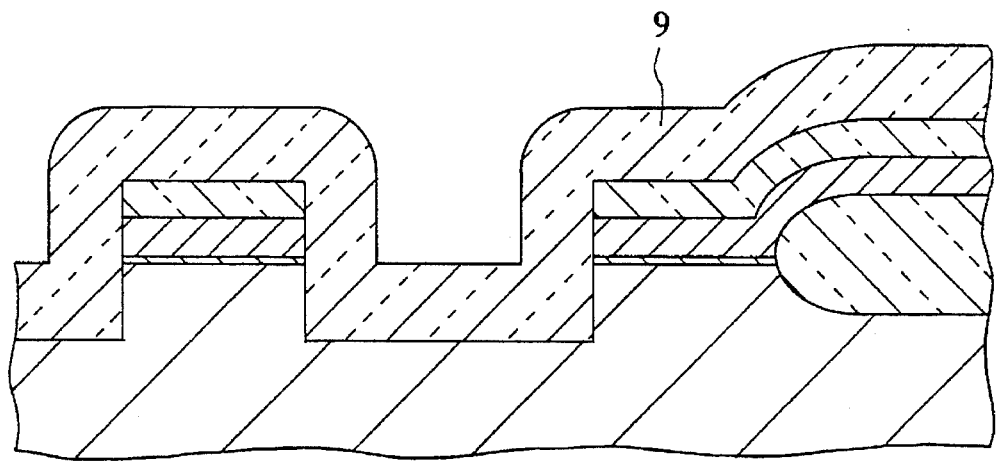
FIG. 9 is a similar cross-sectional view for illustrating the processing step following FIG. 8.

Anisotropic etching is performed through a window 7$b$ to form a trench 8 of 0.2 μm deep at the surface of the p-well as shown in FIG. 8. Thus the first active region is isolated by trench 8 and field oxide film 2. At this stage the silicon oxide film 5$a$ becomes reduced to a thickness of about 100 nm. Etching is carried out at a pressure of 50 mTorr and a constant power of 500 W using a mixed gas of hydrogen bromide HBr, nitrogen trifluoride $NF_3$, and an oxygen-helium mixture in a ratio of 5:1:1 by volume. Thereby a trench with vertical sidewalls can be produced. Subsequently by the low-pressure CVD technique utilizing thermal decomposition of $Si(OC_2H_5)_4$, a silicon oxide film 9 of 200 nm thick is deposited over the entire surface as shown in FIG. 9.

Figure 10A:
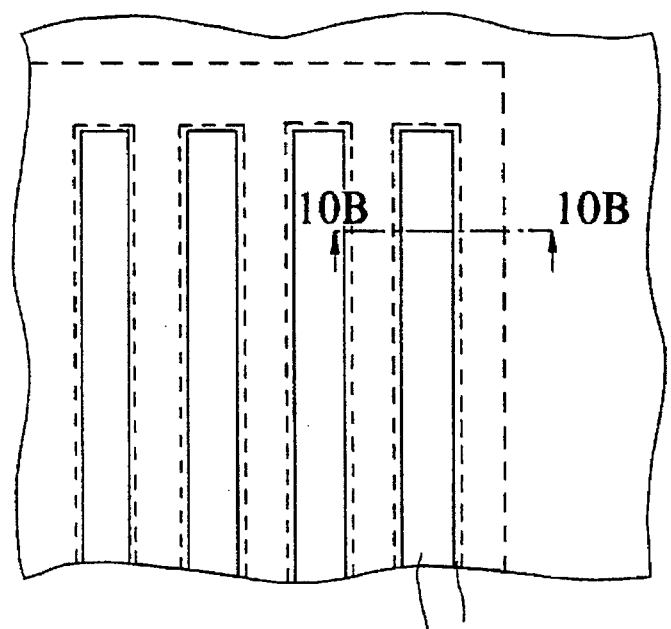
FIG. 10(a) is a plan view for illustrating the processing step following FIG. 9.
Figure 10B:
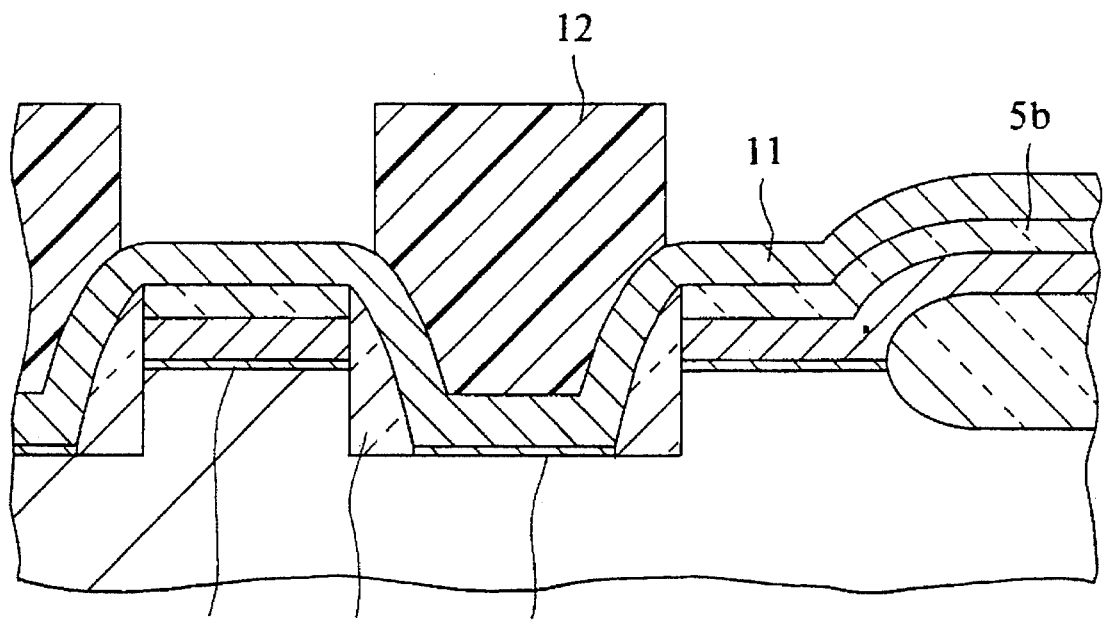
FIG. 10(b) is an enlarged cross-sectional view taken along line A—A.

In the next step, anisotropic etching using a mixed gas of $CHF_3$ and $O_2$ is performed to leave device-isolation insulating films 9$a$ at the sidewalls of the trench as shown in FIGS. 10, with the results of becoming 50 nm in thickness of silicon oxide film 5$b$ and 150 nm in width (contacting with the bottom of the trench) of insulating film 9$a$. The area of the trench bottom uncovered with insulating film 9$a$ is defined as the second active region over the surface of which the second gate oxide film 10 is formed preferably to substantially the same thickness by the same process as gate oxide film 3. Subsequently the second phosphorus-doped polysilicon film 11 of 100 nm thick is deposited over the whole surface, and then only the portion of it within the trench is covered with a photoresist film 12.

Figure 11:
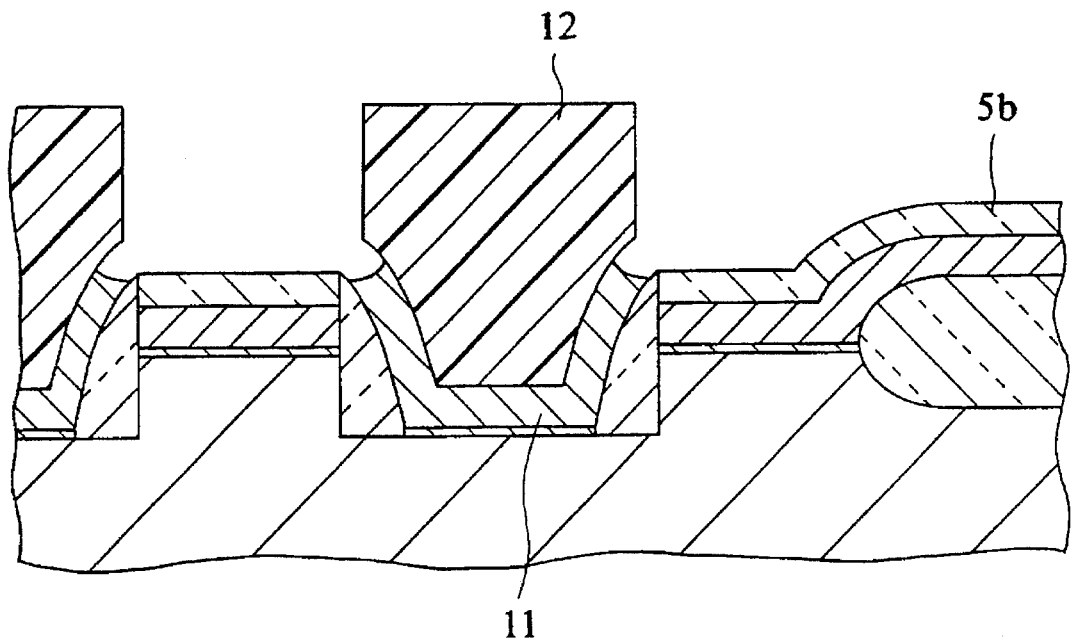
FIG. 11 is a similar cross-sectional view for illustrating the processing step following FIG. 10.
Figure 12:
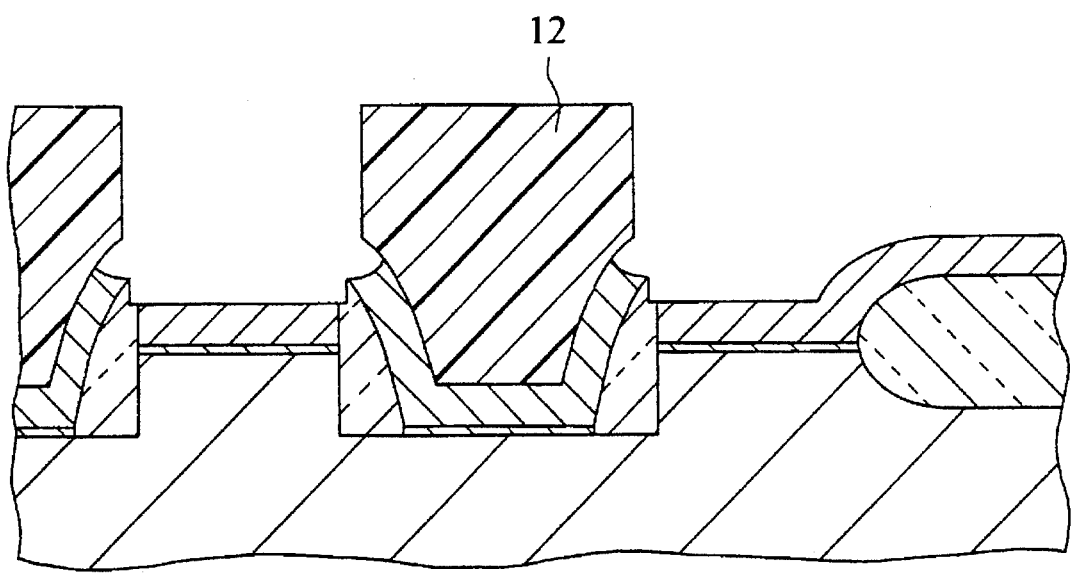
FIG. 12 is a similar cross-sectional view for illustrating the processing step following FIG. 11.

In the next step, the second polysilicon film is etched using photoresist film 12 as mask by isotropic etching with a mixed gas of $CF_4$ and $O_2$ as shown in FIG. 11. By the subsequent anisotropic etching with a mixed gas of $CHF_3$ and $O_2$, silicon oxide film 5$b$ is removed as shown in FIG. 12.

Figure 13A:
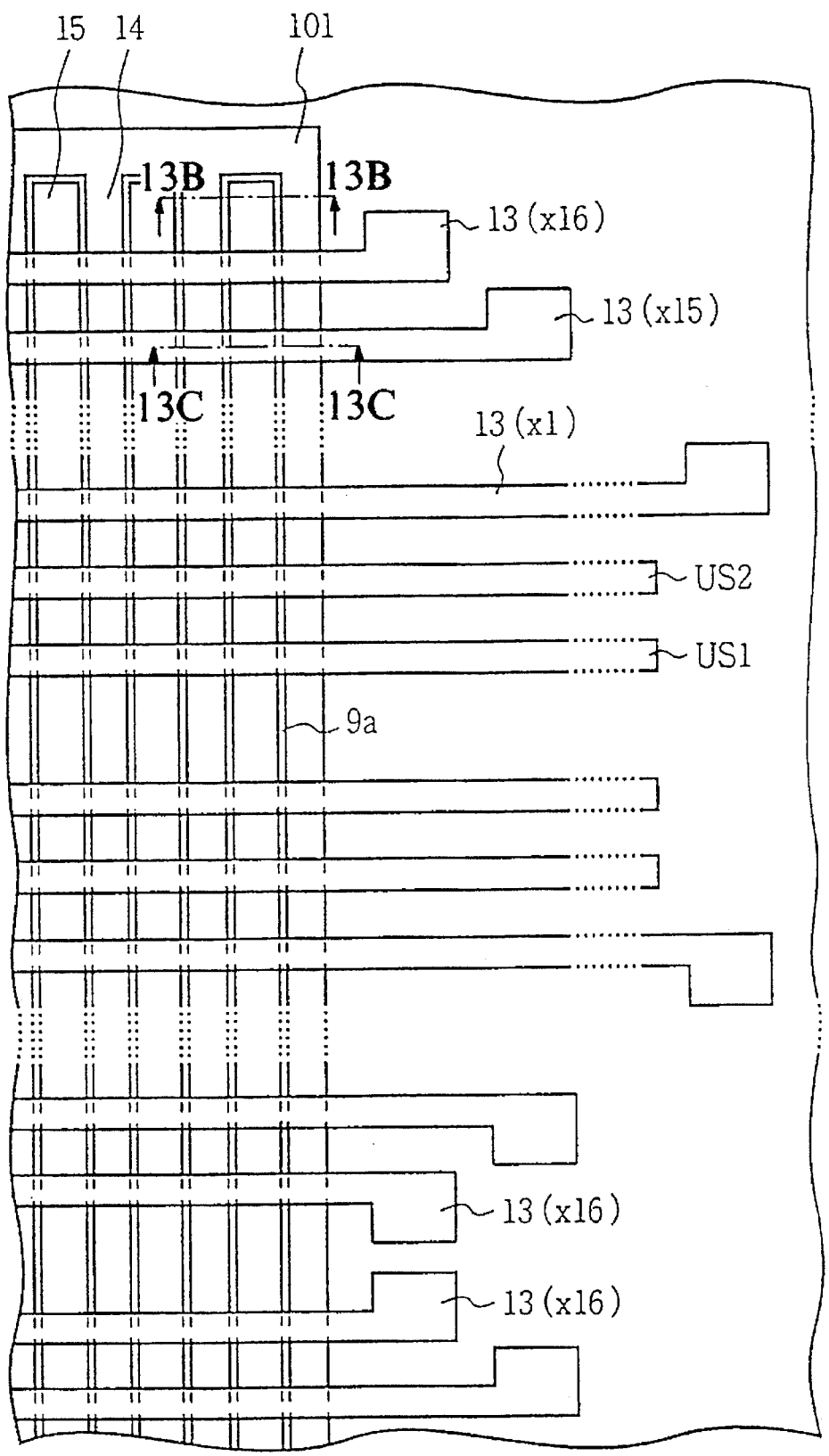
FIG. 13(a) is a plan view for illustrating the processing step following FIG. 12.
Figure 13B:
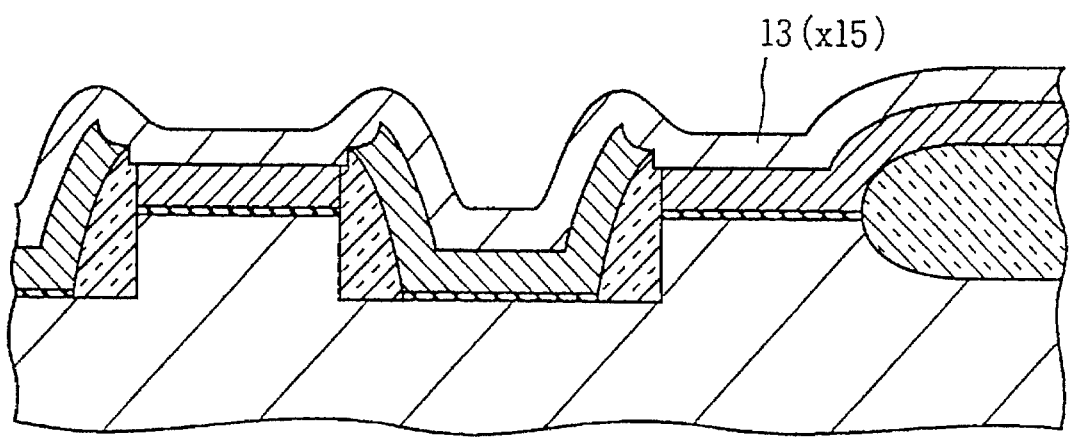
FIG. 13(b) is an enlarged cross-sectional view taken along line A—A of FIG. 13(a).
Figure 13C:
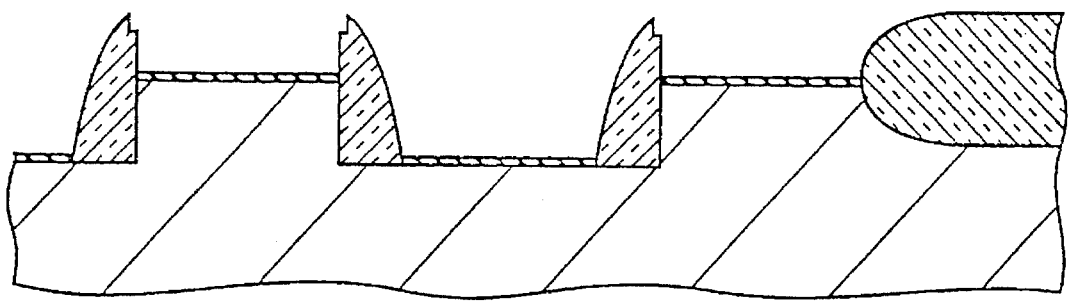
FIG. 13(c) is an enlarged cross-sectional view taken along line B—B of FIG. 13(a).
Figure 14A:
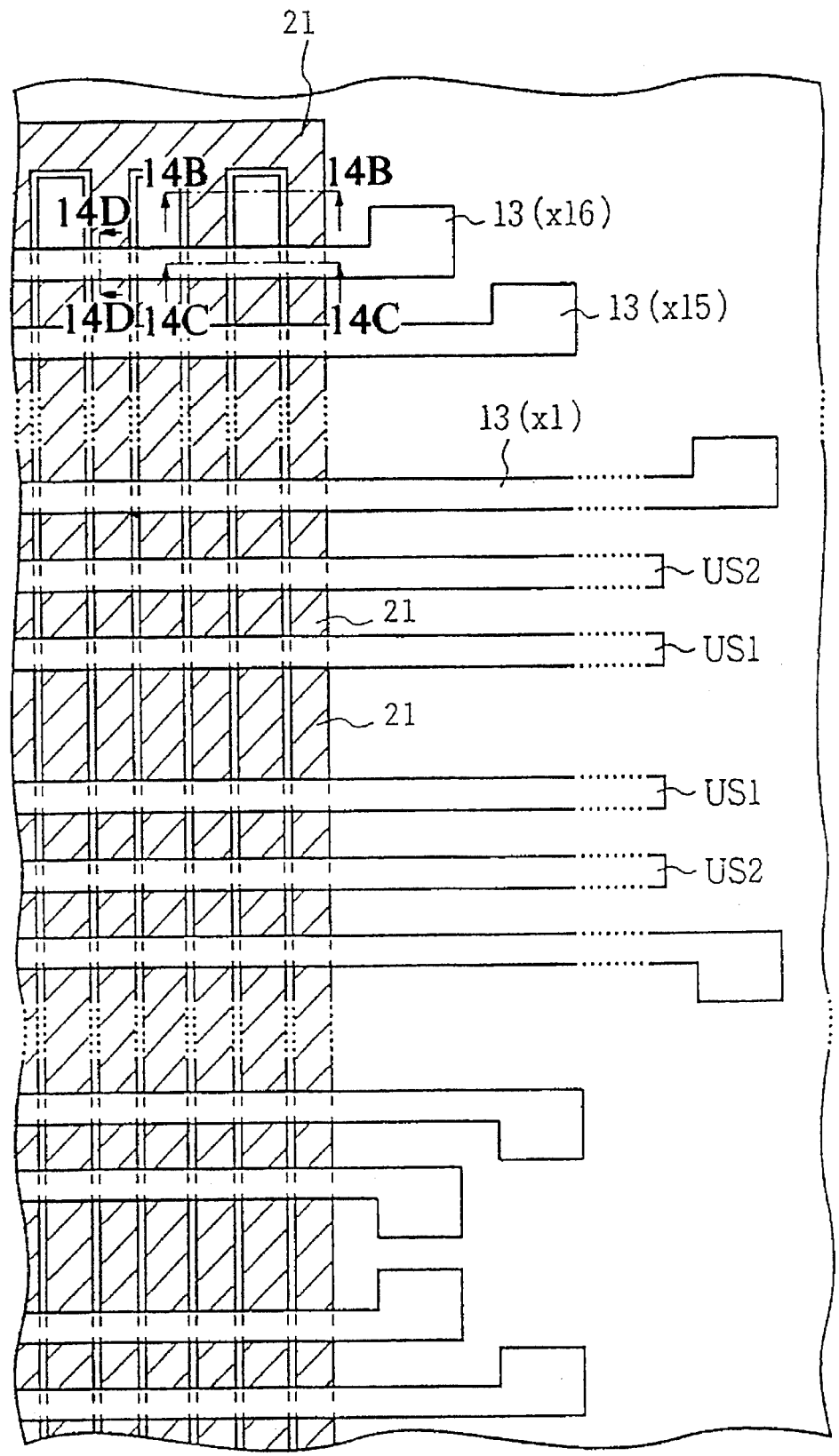
FIG. 14(a) is a plan view for illustrating the processing step following FIG. 13.
Figure 14B:
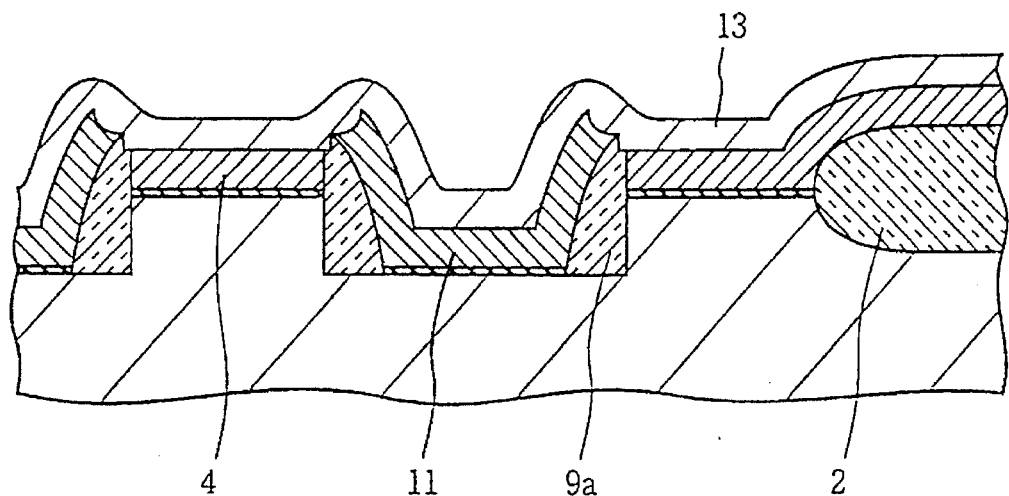
FIG. 14(b) is an enlarged cross-sectional view taken along line A—A of FIG. 14(a).
Figure 14C:
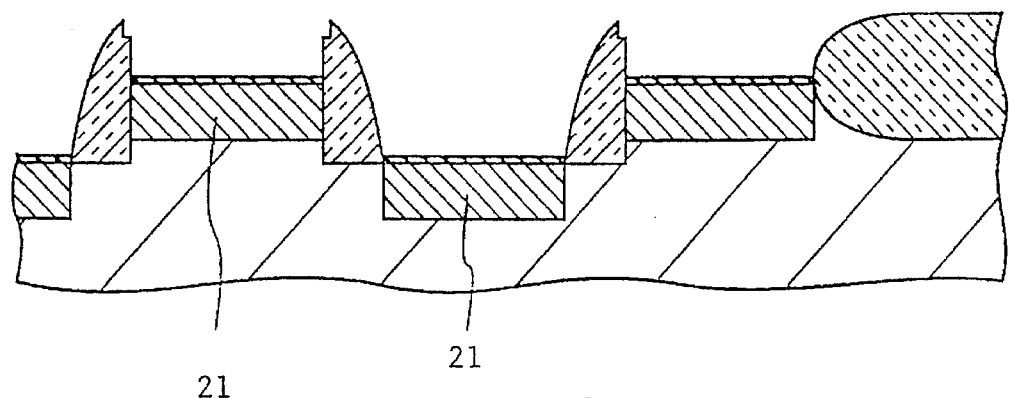
FIG. 14(c) is an enlarged cross-sectional view taken along line B—B of FIG. 14(a).
Figure 14D:
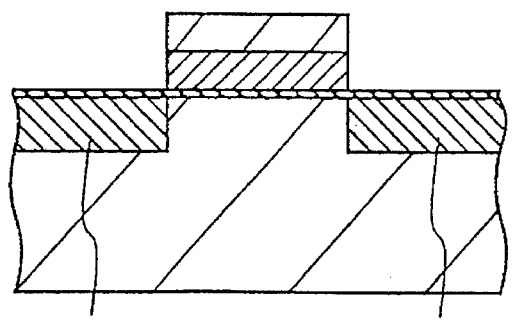
FIG. 14(d) is an enlarged cross-sectional view taken along line C—C of FIG. 14(a).
Figure 15A:
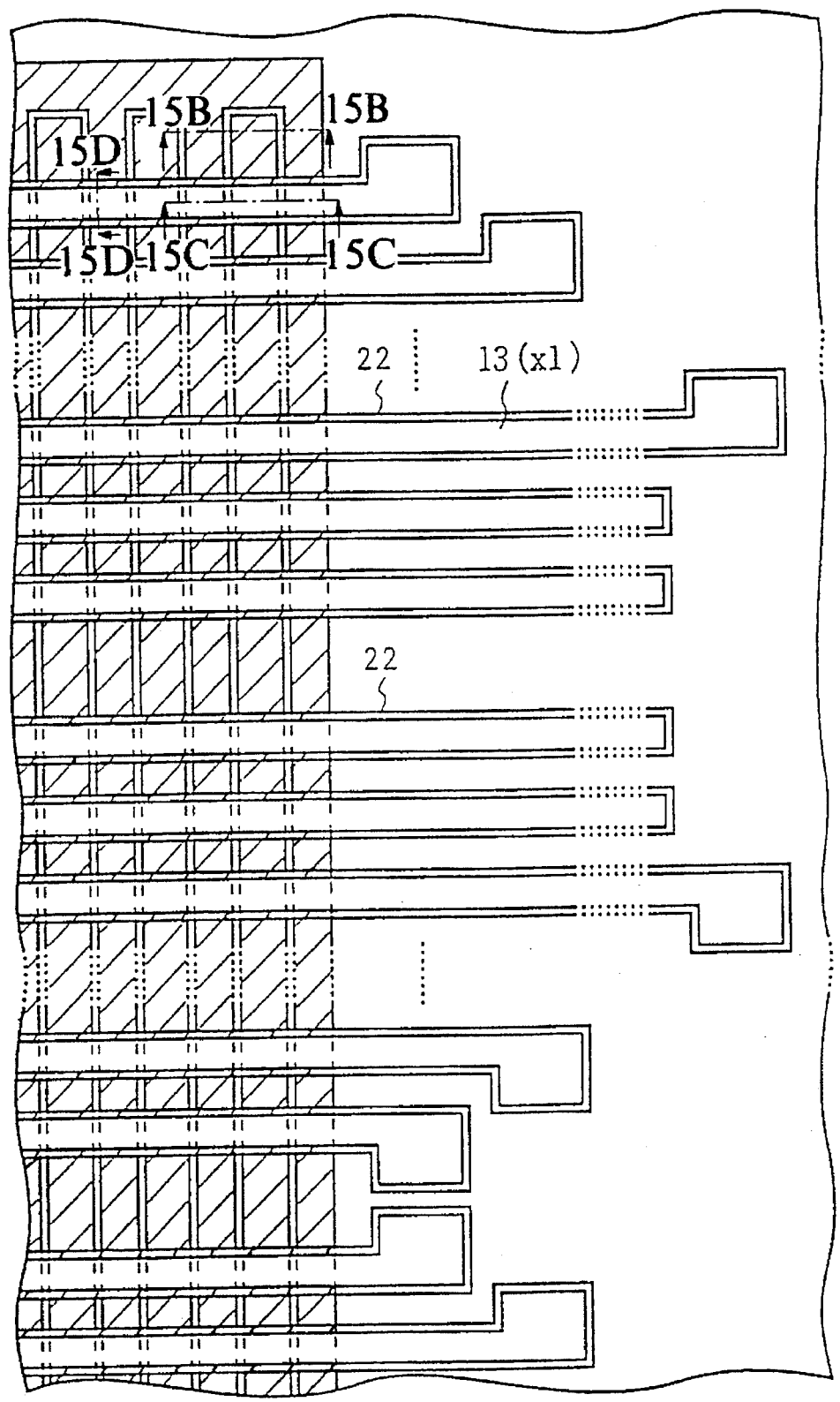
FIG. 15(a) is a plan view for illustrating the processing step following FIG. 14.
Figure 15B:
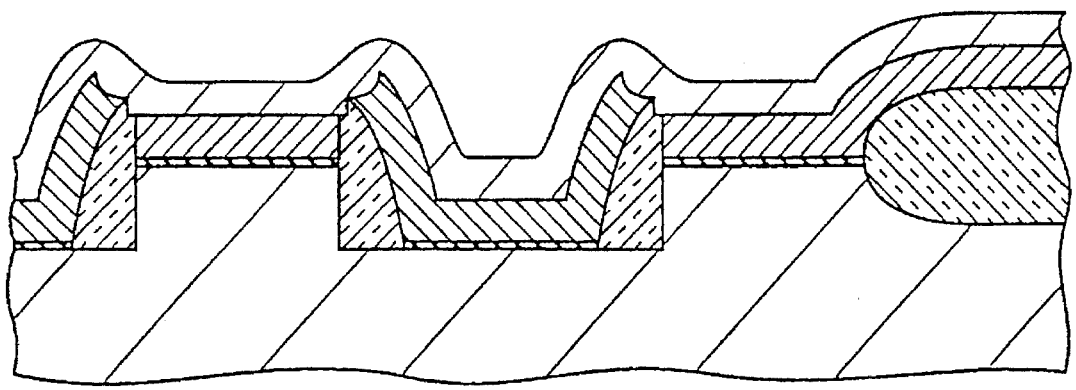
FIG. 15(b) is an enlarged cross-sectional view taken along line A—A of FIG. 15(a).
Figure 15C:
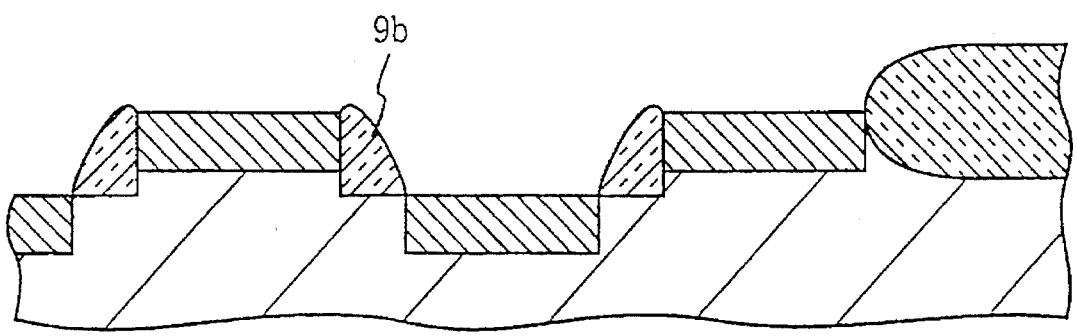
FIG. 15(c) is an enlarged cross-sectional view taken along line B—B of FIG. 15(a).
Figure 15D:
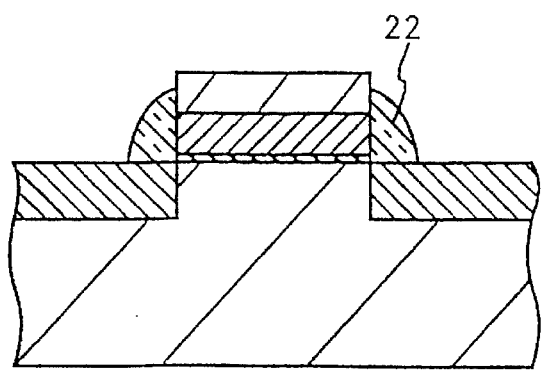
FIG. 15(d) is an enlarged cross-sectional view taken along line C—C of FIG. 15(a).

In the next step, after removing photoresist film 12, as shown in FIGS. 13($a$)–13($c$), a tungsten silicide film 13 is deposited to a thickness of 100 nm over the whole surface, and then patterned to form branch word-lines 13(x1), . . . , 13(x16) acting also as gate electrodes and unit selective lines US1, US2. These branch word-lines 13(x1), . . . cross above the first and second active regions 14, 15 in cell array block region 101. At this stage, gate electrodes of MOSFETs are formed over device regions as of the peripheral circuits, etc.

In the next step, lightly-doped source/drain regions are formed as shown in FIG. 14. Then these are self-aligned with branch word-lines 13(x1), . . . , unit selective lines SU1, SU2. This process is performed by ion implantation of phosphorus at 60 keV and a dose of about $5 \times 10^{13}$ $cm^{-2}$ to form phosphorus-doped layer 21 (shaded with oblique solid lines only). For the post annealing for activation, a later-done thermal (about 900° C.) treatment for dielectric film is utilized.

In the next step, over the entire surface, silicon oxide film is deposited to a thickness of 100 nm and etched back to form insulating spacers 22 at the sidewalls of branch word-lines 13(x1), . . . as shown in FIGS. 15. Then the device-isolation insulating film becomes changed somewhat into the shape indicated by 9$b$.

Figure 16A:
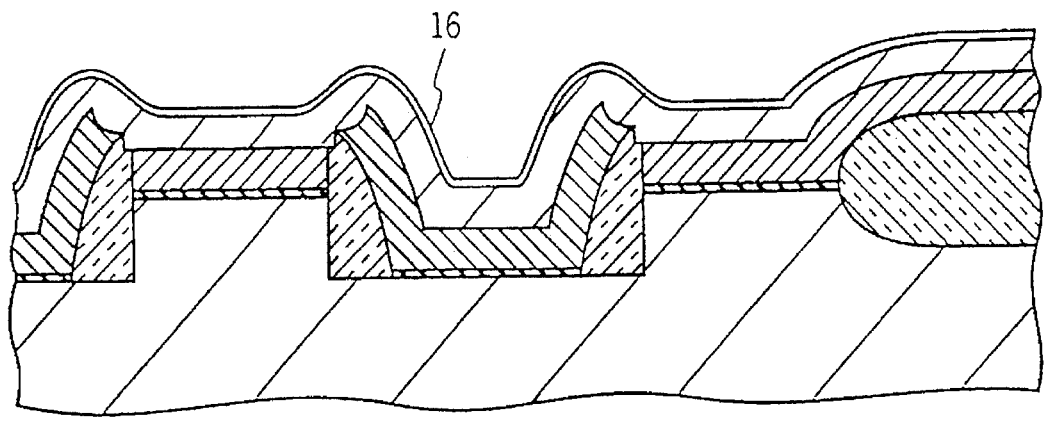
FIG. 16(a) is a cross-sectional view for illustrating the process following, and corresponding to, FIG. 15(b).
Figure 16B:
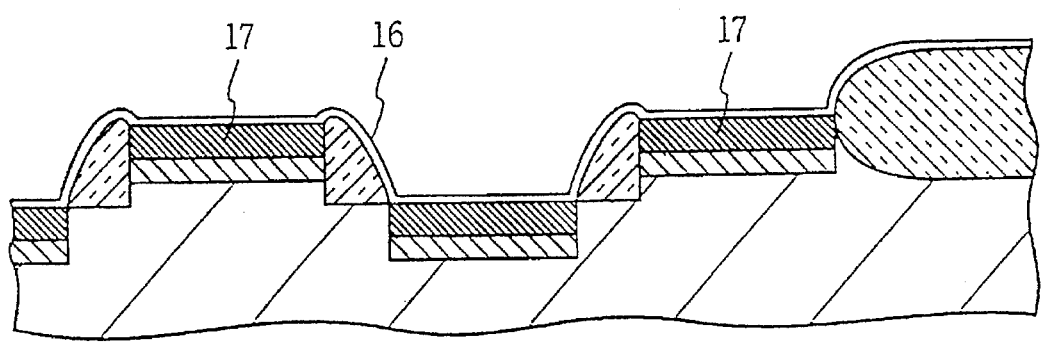
FIG. 16(b) is a similar cross-sectional view corresponding to FIG. 15(c).
Figure 16C:
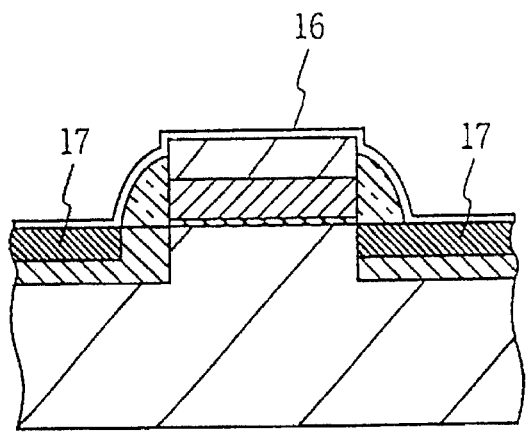
FIG. 16(c) is a similar cross-sectional view corresponding to FIG. 15(d).
Figure 17A:
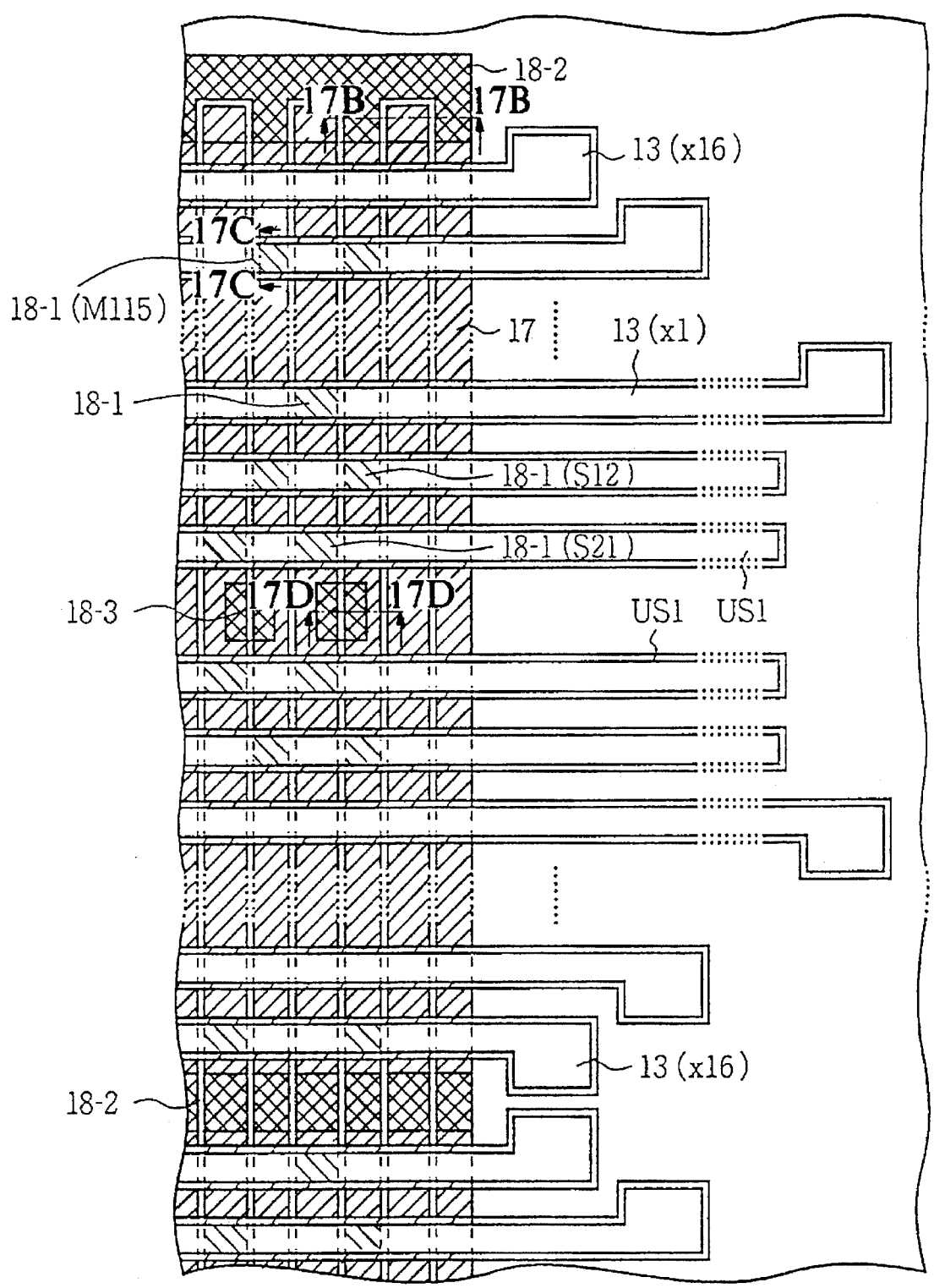
FIG. 17(a) is a plan view for illustrating the processing step following FIG. 16.
Figure 17B:
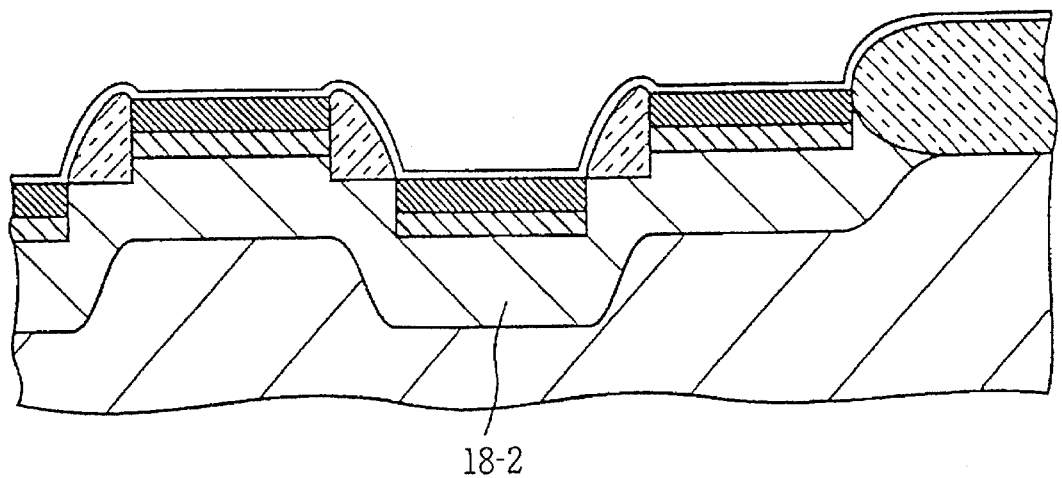
FIG. 17(b) is an enlarged cross-sectional view taken along line A—A of FIG. 17(a).
Figure 17C:
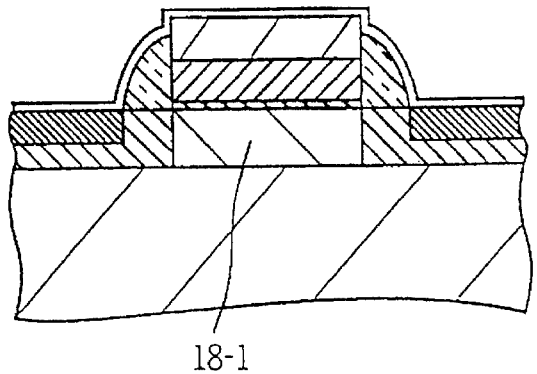
FIG. 17(c) is an enlarged cross-sectional view taken along line B—B of FIG. 17(a).
Figure 17D:
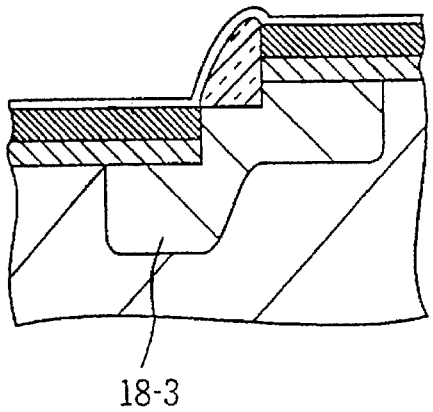
FIG. 17(d) is an enlarged cross-sectional view taken along line C—C of FIG. 17(a).

In the next step, after depositing a silicon oxide film 16 to a thickness of 10 nm over the entire surface, ion implantation of arsenic is performed at 70 keV and a dose of about $5 \times 10^{15}$ $cm^{-2}$ to form a arsenic-doped layer 17 shaded with oblique lines at higher-density as shown in FIG. 16.

In the next step, as shown in FIG. 17, ion implantation of phosphorus is performed at 180 keV and a dose of about $1 \times 10^{14}$ $cm^{-2}$ into the first and second active regions under branch word-lines 13(x1), . . . , that is, selected ones from channel regions of cell transistors or selective transistors, thus to form code-written doped layers 18-1 (shaded with right-down oblique lines). Thus selective transistors S12, S21 are made depletion mode and the correspondent data to a specified codes is written. In this process, phosphorus-doped layer 18-2 is formed similarly also on one side of word-line branch 13(x16). This is because of forming X-ground line. Similarly phosphorus-doped layers 18-3 are formed also on one side of unit selective lines US1. Phosphorus-doped layers 18-3 are formed in order to connect the first unit arrays disposed in the first active region and the second unit arrays disposed in the second active region to the same digit line.

Figure 18A:
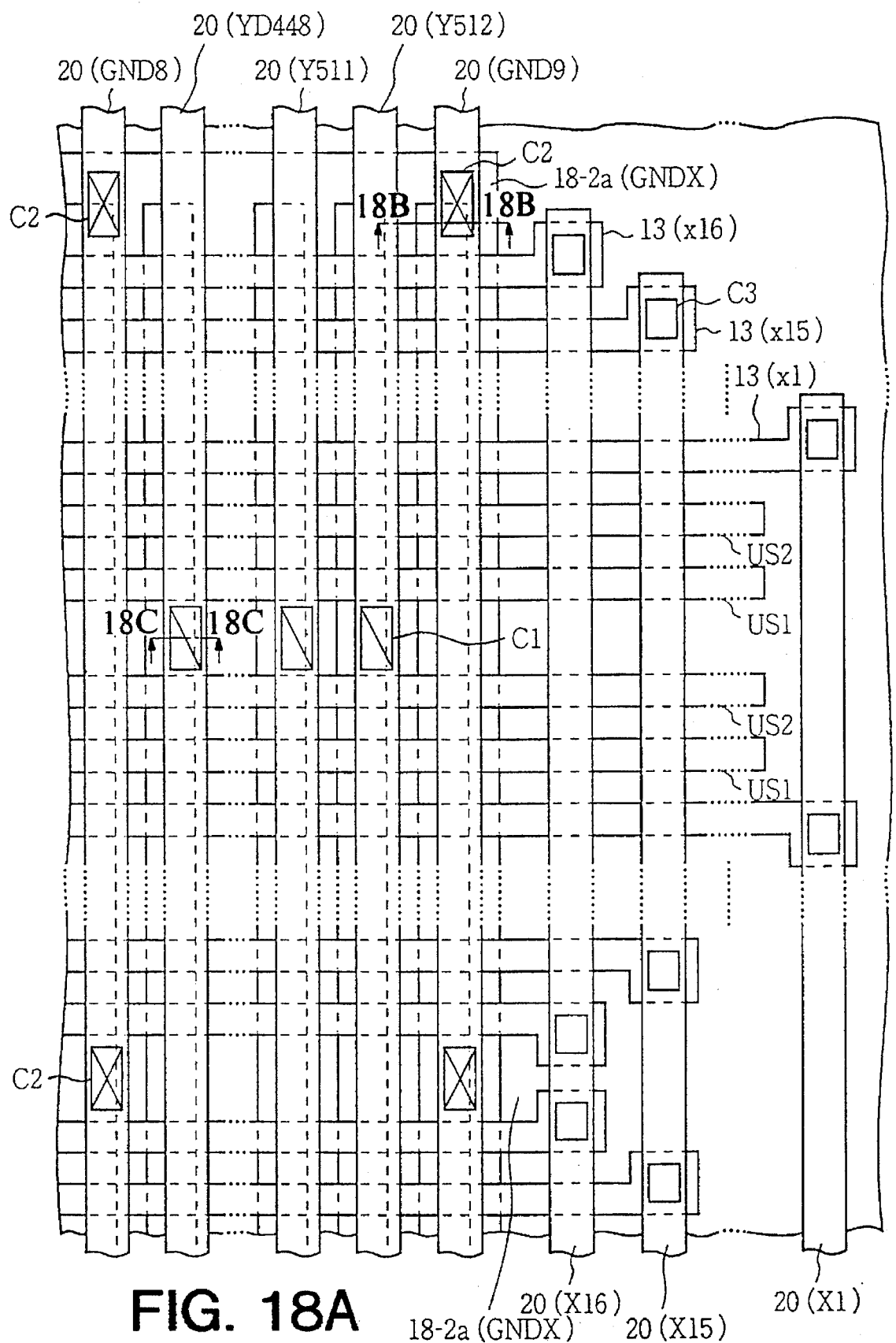
FIG. 18(a) is a plan view for illustrating the processing step following FIG. 17 and showing cell array blocks.
Figure 18B:
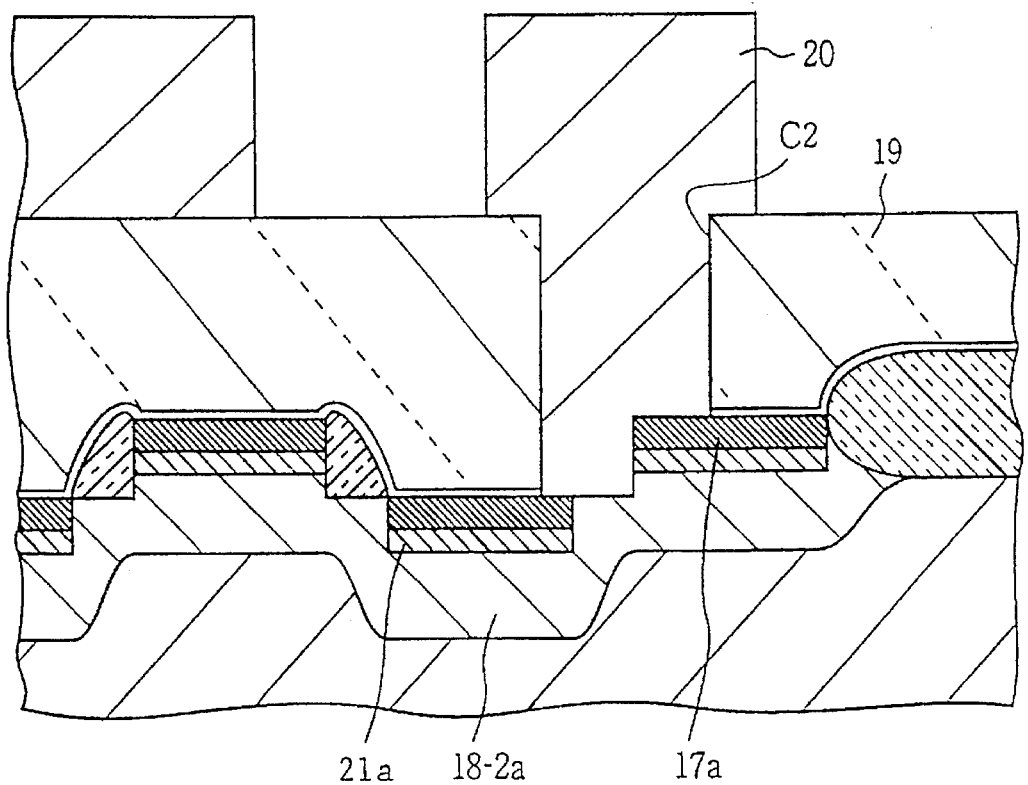
FIG. 18(b) is an enlarged cross-sectional view taken along line A—A of FIG. 18(a).
Figure 18C:
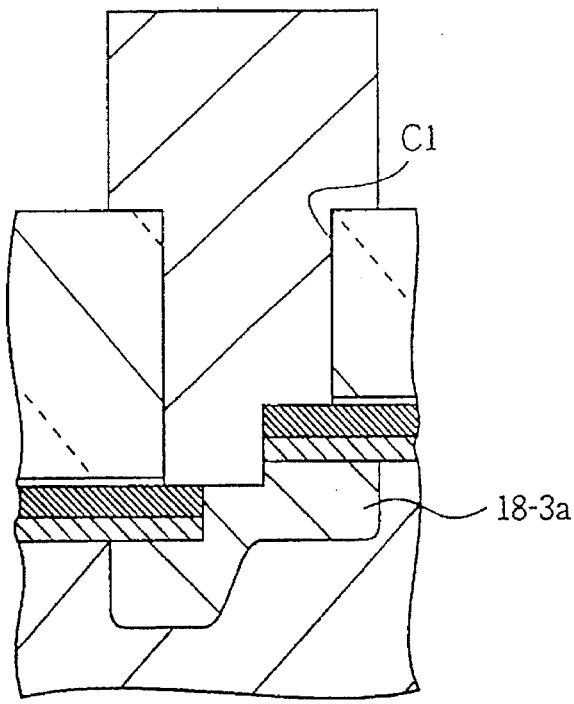
FIG. 18(c) is an enlarged cross-sectional view taken along line B—B of FIG. 18(a).

In the next step, BPSG or the like is deposited and planarized to form dielectric film 19 as shown in FIG. 18. At this stage, not only phosphorus-doped layer 21, arsenic-doped layer 17 and phosphorous-doped layer 18-2 are activated but also impurity diffusion occurs somewhat, so that the phosphorus-doped layer 21 and the arsenic-doped layer 17 results in a lightly-doped source/drain region 21$a$ and a highly-doped source/drain region 17$a$ of each cell transistor. Further, the phosphorous-doped layer 18-2 results in a diffused layer 18-2$a$ serving as the X-ground line. Subsequently after forming contact holes C1 (represented by rectangle with one diagonal line)and C2 (represented by rectangle with two diagonal lines) are formed over the areas including the stepped positions, respectively, and through holes C3 (represented by open rectangle) are formed over the ends of branch word-lines 13(x1), . . . , an Al—Si alloy film 20 are deposited and patterned, thus the trunk word-lines 20(x1), . . . , digit lines 20(Y512), . . . , and Y-ground lines 20 (GND9), . . .

In the above-described process, exposure of photoresist film 12 in FIG. 10, and also exposure of photoresist film for patterning of tungsten silicide film 13, etc. in FIG. 14, and for patterning of Al—Si alloy film 20 in FIG. 18 can be accomplished using the CEL technique which is introduced in the paper "Contrast Enhanced Photolithography" IEEE Electron Device Letters, Vol. EDL-4, No.1, January 1983. This technique involves a set of steps of coating with a bleachable material such as CEM-2 (Product by GE Inc.) to a thickness of 100 to 300 nm, exposure and removing the CEL film before development of the photoresist. Positive photoresist films will become in itself increased in transparency by exposure. At present it is possible to form precise patterns without always needing the use of the CEL technique.

In this embodiment, the minimum feature size involving photolithography is 0.4 μm, and the needed size for insulation between the first and second active regions is the width (about 0.15 μm) of device isolation sidewalls 9b of insulating film. The trench isolation technique of interposing a trench between the neighboring unit arrays requires at least 0.4 μm for it. Accordingly the width of the cell array block region is about 0.25 mm more. This embodiment permits to reduce about 2 mm the length of the short edges of semiconductor chip.

In the embodiment described above, after forming insulating films 9a as sidewalls shown in FIG. 10, the second polysilicon film 11 deposited is reduced to a thickness of 100 nm. Instead it may be permitted to fill up the trench with the second polysilicon film deposited to a thickness of 1.6 μm or at least twice the trench width, and subsequently etch back it to a thickness of 100 nm over the second active region. This gives an advantage of making formation of photoresist film 12 unneedful.

It could be easily anticipated by the person in the art that the present invention can be applied also to flash EPROM as well as the mask ROM described above.

Although the invention has been described with reference to specific embodiments, this description is not meant to be construed in a limiting sense. Various modifications of the disclosed embodiments as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A read-only memory device comprising:
a semiconductor substrate;
a plurality of memory cell units each capable of storing a discrete unit of information and including a plurality of memory cell transistors connected in series to one another; and
a plurality of trenches selectively formed in said semiconductor substrate in parallel to one another to thereby define in said semiconductor substrate a plurality of first area portions each sandwiched between the adjacent ones of said trenches and a plurality of second area portions each corresponding to a bottom portion of an associated one of said trenches,
first ones of said memory cell units being formed respectively in said first area portions of said semiconductor substrate such that all of said memory cell transistors in each of said first ones of said memory cell units has both a source and a drain region formed in an associated one of said first area portions of said semiconductor substrate, and
second ones of said memory cell units being formed respectively in said second area portions of said semiconductor substrate such that all of said memory cell transistors in each of said second ones of said memory cell units has a source and a drain region both formed in an associated one of said second area portions of said semiconductor substrate.

2. The memory device as claimed in claim 1, wherein each of said memory cell transistors in each of said first ones of said memory cell units further has a gate electrode formed over said associated one of said first area portions of said semiconductor substrate in isolation therefrom by a gate insulating film and each of said memory cell transistors in each of said second ones of said memory cell units further has a gate electrode formed over said associated one of said second area portions of said semiconductor substrate in isolation therefrom by a gate insulating film.

3. The memory device as claimed in claim 2 further comprising a plurality of word lines formed over said semiconductor substrate to cross over each of said trenches, each of said word lines being connected in common to the gate electrodes of associated ones of said memory cell transistors of said first and second ones of said memory cell units.

4. A read-only memory device comprising:
a semiconductor substrate;
at least first and second trenches selectively formed in said semiconductor substrate in parallel to each other to thereby define in said semiconductor substrate a first area portion sandwiched between said first and second trenches, a second area portion corresponding to a bottom portion of said first trench and a third area portion corresponding to a bottom portion of said second trench;
a plurality of first memory cell transistors formed in their entirety except a gate electrode in line in said first area portion of said semiconductor substrate such that each of said first memory cell transistors has a source and a drain region formed in said first area portion and said gate electrode formed over said first area portion in isolation therefrom by a gate insulating film;
a plurality of second memory cell transistors formed in their entirety except a gate electrode in line in said second area portion of said semiconductor substrate such that each of said second memory cell transistors has a source and a drain region formed in said second area portion and said gate electrode formed over said second area portion in isolation therefrom by a gate insulating film;
a plurality of third memory cell transistors formed in their entirety in a line in said third area portion of said semiconductor substrate such that each of said third memory cell transistors has a source and a drain region formed in said third area portion and a gate electrode formed over said third area portion in isolation therefrom by a gate insulating film; and
a plurality of word lines each formed to cross over each of said first, second and third area portions of said semiconductor substrate and connected in common to the gate electrodes of associated ones of said first, second and third memory cell transistors.

5. The memory device as claimed in claim 4, wherein each of said first and second trenches are elongated in a first direction so that the source and drain regions of each said first, second and third memory cell transistors are arranged in line in said first direction, and
each of said word lines extends in a second direction perpendicular to said first direction.

6. A read-only memory device comprising:
a semiconductor substrate;
a plurality of trenches selectively formed in said semiconductor substrate in parallel to one another in a first direction to thereby define in said semiconductor substrate a plurality of first area portions each sandwiched between the adjacent ones of said trenches and a plurality of second area portions each corresponding to a bottom portion of an associated one of said trenches, said first and second area portions being arranged in parallel to one another in said first direction;
a plurality of diffusion regions serving as source and drain regions of memory cell transistors and formed in each of said first and second area portions of said semiconductor substrate in line in said first direction apart from one another, wherein said memory cell transistors are formed in their entirety except a gate electrode in one of said first and second area portions; and a plurality of word lines formed in parallel to one another in a second direction perpendicular to said first direction to cross over each of said first and second area portions of said semiconductor substrate in isolation therefrom by an insulating film, each of said word lines having portions each serving as said gate of each of the memory cell transistors which are formed respectively in said first and second area portions of said semiconductor substrate.

* * * * *